US005612804A

United States Patent [19]
Hara

[11] Patent Number: 5,612,804
[45] Date of Patent: Mar. 18, 1997

[54] LIQUID CRYSTAL DISPLAY WITH AN ELECTRODE CONNECTOR

[75] Inventor: Minoru Hara, Tokyo, Japan

[73] Assignee: Olympus Optical Co., Ltd., Tokyo, Japan

[21] Appl. No.: 125,678

[22] Filed: Sep. 22, 1993

[30] Foreign Application Priority Data

Nov. 2, 1992 [JP] Japan .................................. 4-294493

[51] Int. Cl.⁶ .................................................. G02F 1/1345
[52] U.S. Cl. ........................................ 349/149; 349/152
[58] Field of Search ............................... 359/82, 88, 89;
257/785

[56] References Cited

U.S. PATENT DOCUMENTS

| | | | |
|---|---|---|---|
| 4,515,440 | 5/1985 | Mosier | 359/88 |
| 4,516,835 | 5/1985 | Suzuki et al. | 359/89 |
| 4,597,635 | 7/1986 | Hoshikawa | 359/83 |
| 4,601,526 | 7/1986 | White et al. | 257/785 |
| 4,624,529 | 11/1986 | Dorfman | 359/88 |
| 4,806,922 | 2/1989 | McLaughlin et al. | 359/88 |
| 4,896,946 | 1/1990 | Suzuki et al. | 359/88 |
| 5,450,221 | 9/1995 | Owen et al. | 359/83 |

FOREIGN PATENT DOCUMENTS

| | | | |
|---|---|---|---|
| 1060567 | 8/1979 | Canada | 359/89 |
| 120976 | 9/1978 | Japan . | |
| 123381 | 9/1981 | Japan . | |
| 59-151136 | 8/1984 | Japan | 359/88 |
| 30930 | 9/1984 | Japan . | |
| 22743 | 5/1991 | Japan . | |

*Primary Examiner*—William L. Sikes
*Assistant Examiner*—Charles Miller
*Attorney, Agent, or Firm*—Louis Weinstein

[57] ABSTRACT

A liquid crystal display in which one end portion of a transparent film forming a film liquid crystal device is extended and connection terminals on which connection electrodes extending from transparent electrodes are formed are provided on an end of the extended portion. The connection electrodes formed on the connection terminals has a configuration corresponding to the configuration of electrodes formed on a liquid crystal drive circuit board electrically connected to the film liquid crystal device. The electrodes of the connection terminals and the electrodes formed on the liquid crystal drive circuit board are pressed and fixed on each other to establish an electrical connection therebetween.

13 Claims, 12 Drawing Sheets

|  | SEG 0 | SEG 1 | SEG 2 | SEG 3 | SEG 4 | SEG 5 |
|---|---|---|---|---|---|---|
| COM 0 |  | X | X |  | O | O |
| COM 1 | O | O | O | X | O | O |
| COM 2 | O | O | X | X | O |  |

O LIGHTING
X UN LIGHTING

LIQUID CRYSTAL DISPLAY WITH AN ELECTRODE CONNECTOR

BACKGROUND OF THE INVENTION

1. Field of the Invention

This invention relates to a liquid crystal display and, more particularly to a means for connecting a liquid crystal display using a plastic film and a drive circuit board having a liquid crystal display control circuit for applying a display signal to display elements of the film liquid crystal display.

2. Related Background Art

Liquid crystal displays are well known in which pictures, characters and the like representing information are displayed by driving a liquid crystal device (LCD) by an electrical signal.

An example of a conventional LCD arrangement using glass plates will be described below with reference to FIGS. 9 and 10. An LCD 50 shown in FIGS. 9 and 10 has a pair of glass plates 51 and 55 facing each other. A segment electrode 53 and a portion of a common electrode 54 are provided on an inner surface of one of the pair of the glass plates, i.e., the glass plate 51, and an orientation film 57 is formed as an innermost layer. The other glass plate 55 has another portion of the common electrode 54 and an orientation film 57 formed on its inner surface and is superposed on the glass plate 51. Peripheral portions of these glass plates are sealed with a sealing member 58. A liquid crystal 59 is injected through an inlet 62 (see FIG. 10) to be enclosed between the glass plates. The common electrode 54 is connected to an electrode terminal 52 (see FIG. 10) through a conductive member 60. Polarizing plates 56 and 63 are provided on outer surfaces of the glass plates 51 and 55, respectively, and a reflecting plate 84 is provided on the polarizing plate 83.

To the LCD 50 using the thus-constructed glass plates, a liquid crystal drive circuit board having a liquid crystal display control circuit is connected to enable the LCD 50 to operate for displaying.

Conventionally, a conductive rubber connector, an anisotropic connector, a pin connector or the like, for example, is used as a connection means for this purpose. Japanese Utility Model Publication No. 30930, Showa 59 (1984) discloses a connection means using a conductive rubber connector as shown in FIGS. 11 and 12. That is, conductive rubber connectors 66 each formed of insulating rubber members 66a and 66b and a conductive rubber member 66c interposed between the rubber members 66a and 66b, as shown in FIG. 12, are pinched between a liquid crystal drive circuit board 65 and an LCD 50, and an end of the LCD 50 facing each conductive rubber connector 66 is held by an LCD holding member 67 attached to the drive circuit board 65, as shown in FIG. 11. Electrode terminals of the LCD 50 and connection terminals of the circuit board 65 are thereby connected electrically.

A connection means using an anisotropic connector is also known which is constructed as shown in FIGS. 13 and 14. An anisotropic connector 69 is pinched between a liquid crystal drive circuit board 68 formed of a flexible printed circuit board (FPC) and electrode terminals of an LCD 50 and is bonded to these members by heating and pressing to electrically connect the electrode terminals of the LCD 50 and connection terminals of the circuit board 68.

A connection means using a pin connector is also known which is constructed as shown in FIG. 15. Electrode terminals of an LCD 50 are pinched between a pair of pin connectors 70 so that the electrode terminals and the pin connectors 70 are electrically connected, and the pin connectors 70 are soldered to terminals on a liquid crystal drive circuit board 71.

Thus, each connection means connects the LCD to the liquid crystal drive circuit board. Japanese Utility Model Publication No. 22743, Heisei 3 (1991) discloses another type of connection means with a film liquid crystal cell. This connection means comprises a hot melt type conductive adhesive which is applied to a connector portion and is heated and pressed with a hot pressing jig to form an electrical connection.

The above-described conventional connection means, however, have drawbacks which are described below. That is, the connection means using conductive rubber connector 66 as shown in FIGS. 11 and 12 is unsatisfactory in terms of assembly performance because the connector is liable to topple due to its elasticity, and the connection means using an anisotropic connector 69 as shown in FIGS. 13 and 14 increases the manufacturing cost because it necessitates a special hot pressing machine. Moreover, if a connection failure occurs, it is difficult to repair or reuse the connected portions because of difficulty in disassembling the connected portions. In the case of the connection means using pin connector 70 as shown in FIG. 15, the pitch at which pin connector terminals are arranged is so large that the number of LCD display elements is limited. In the case of the connection means with a film liquid crystal cell, the number of manufacturing steps and the manufacturing cost are increased since a hot melt type conductive adhesive is applied and a hot pressing jig is used. Recently, a film liquid crystal display module called a film LCD, using an engineering plastic film as a transparent base in place of glass, has been developed and put to practical use.

The film LCD is a display device characterized by solving the problem of conventional glass type LCDs, i.e., difficulty in achieving reductions in thickness and weight and improvement in flexibility. Since a transparent plastic film is used as a case, the liquid crystal can be freely formed into a circular shape, an elliptical shape or the like. Also, the film LCD can be easily worked by drilling. Therefore, the film LCD is most suitable for use as a display for cameras and the like.

SUMMARY OF THE INVENTION

An object of the present invention is to provide a liquid crystal display in which, when a display device is formed by using a film LCD having the above-described features, the film LCD and a liquid crystal drive circuit board having a liquid crystal display control circuit for driving the film LCD can be electrically connected without the need for an intermediate member such as a connector, and which can be assembled efficiently.

Another object of the present invention is to provide a camera finder device having a liquid crystal display using a film LCD connected to a liquid crystal drive circuit board by a connection means in accordance with the present invention, the liquid crystal display being used as a display device in a finder of a camera.

Still another object of the present invention is to provide a camera display device having a liquid crystal display using a film LCD connected to a liquid crystal drive circuit board by a connection means in accordance with the present invention, the liquid crystal display being incorporated in a lens barrel of a camera.

The liquid crystal display control circuit used in the present invention is a well-known one.

The prior art control circuit described herein is a μPD753 xx series (4-BIT SINGLE-CHIP MICROCOMPUTER) of "USER'S MANUAL" of NEC (Nippon Denki Kabushiki Kaisha) published December 1991. The aforesaid control circuit may be used in the present invention as the display control circuit of the film LCD.

Normally, a method of driving an LCD includes one of the following two types:

(a) static drive; and (b) time-division (or dynamic) drive.

In the present invention, the time-division drive is preferably used, wherein a segment electrode and a common electrode are suitably selected to apply voltage in a time division manner.

A further object of the present invention is to provide a novel liquid crystal display having a structure using a film LCD.

To achieve these objects, according to the present invention, there is provided a liquid crystal display using a film LCD in which a liquid crystal is enclosed between a pair of flexible transparent film bases facing each other and having transparent electrodes formed thereon, and in which one end portion of the transparent film is extended and connection terminal means extending from transparent electrode is provided on the extended portion. The connection terminal means is formed so as to have an electrode configuration opposed to the configuration of electrodes of connected terminal means formed on a liquid crystal drive circuit board having a liquid crystal display control circuit to which the film LCD is to be connected. Also, the pair of opposed flexible transparent bases on which the transparent electrodes are disposed may be provided as one sheet of plastic film which is doubly folded to have opposed portions.

According to the present invention, an end portion of the transparent film forming the film LCD is extended and the connection terminal means led from the transparent electrodes are provided on the extended portion. Also, the connection terminal means is formed so as to have the electrode configuration opposed to the electrode configuration of the connected terminal means on the liquid crystal drive circuit board. The film LCD and the drive circuit board are electrically connected by pressure-fastening means such as a screw. The need for a connector member for connecting the film LCD and the drive circuit board such as that used in the conventional arrangement is eliminated and the liquid crystal display is improved in assembly performance and can be easily repaired. Also, there is no need for a special machine for heat bonding, and the problem of separation or the like can be avoided. Thus, a reliable connection can be achieved.

These and other objects, features and advantages of the present invention will become apparent from the following detailed description of the invention.

DESCRIPTION OF THE PREFERRED EMBODIMENTS

Figure 1:
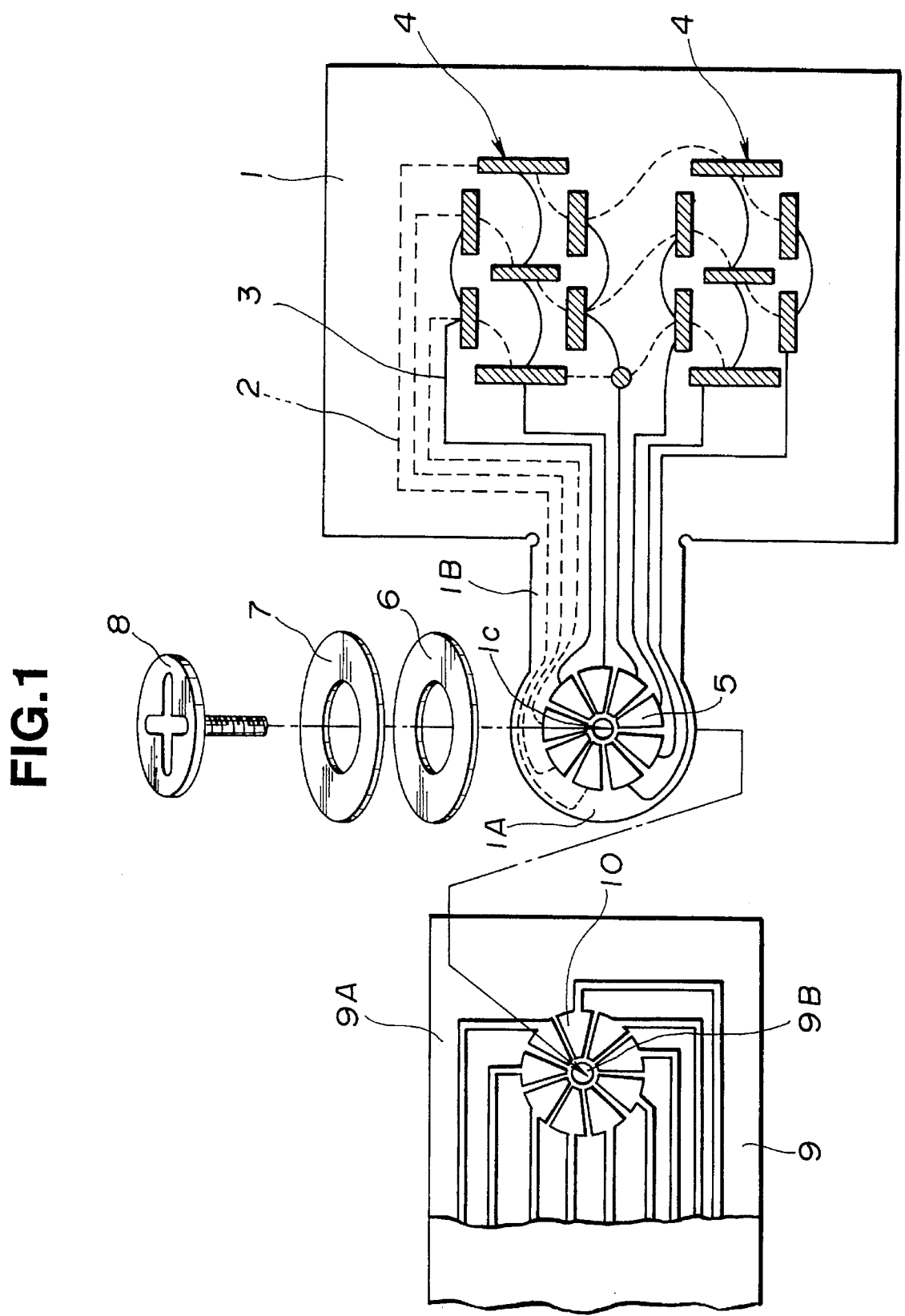
FIG. 1 is an exploded view of the construction of a connection means for connecting a liquid crystal display to a liquid crystal drive circuit board in accordance with a first embodiment of the present invention.

FIG. 1 is a schematic diagram of the structure of connection between a liquid crystal display and a circuit board for driving the liquid crystal display in accordance with a first embodiment of the present invention.

A film LCD 1 using a pair of transparent engineering plastic films forming flexible transparent bases on which transparent electrodes are disposed has at its center a pair of upper and lower liquid crystal display portions 4 formed of seven segments. Segment electrodes 3 formed of transparent electrodes and common electrodes 2 also formed of transparent electrodes are formed to extend from the display portions 4 to a connection terminal portion 1A described below.

The connection terminal portion 1A is formed in such a manner that a middle portion of an edge of one of the pair of transparent films forming the film LCD 1 is extended outward relative to the other film to form an extended portion 1B, and an end of the extended portion 1B is formed into a circular shape. Connection terminals 5 for applying operating voltages to the transparent electrodes are provided on the connection terminal portion 1A.

The connection terminals 5 are formed by being arranged in correspondence with connected terminals 10 extending from a liquid crystal display control circuit (not shown for purposes of simplicity) formed on a liquid crystal drive circuit board 9 to a connected terminal portion 9A which is an end portion of the circuit board 9. The connection terminals 5 can connect to the connected terminals 10 by being brought into contact with the same.

That is, the connected terminals 10, provided as a second group of connection terminals formed on the connected terminal portion 9A at an end of the liquid crystal drive circuit board 9, are formed in a many-petaled corolla-like configuration corresponding to the configuration of sectors divided from a circle at equal angles. The connection terminals 5, provided as a first group of connection terminals formed on the connection terminal portion 1A, also form a many-petaled corolla-like configuration like corresponding to the configuration of sectors divided from a circle at equal angles, which corresponds to the electrode configuration of the connected terminals 10. A threaded hole 9B, through which a connection fixing screw 8 described below is passed for fastening, is formed in the connected terminal portion 9A of the circuit board 9 at the center of the connected terminals 10. Also, a through-hole 1C, through which the connection fixing screw 8 can pass, is also formed through the connection terminal portion 1A at the center of the connection terminals 5. Transparent conductor patterns extending from the common electrodes 2 and the segment electrodes 3 are connected to the connection terminals 5. The connection terminals 5 are also formed by transparent conductor patterns.

In this embodiment, the connection terminal portion 1A formed on the film LCD 1 as described above is superposed on the connected terminal portion 9A at an end of the liquid crystal drive circuit board 9 so that the connection terminals 5 or the first connection terminals face the connected terminals 10 or the second connection terminals in a predetermined relationship. Thereafter, the connection fixing screw 8, having a rubber washer 6 and a washer 7 fitted around its shank, is passed through the through hole 1C and is screwed into the threaded hole 9B of the circuit board 9. In this manner, the connection terminal portion 1A is fixed by screwing on the circuit board 9, and the connection terminals 5 are brought into contact with the connected terminals 10 by being pressed against the same, thereby establishing an electrical connection between the terminals 5 and 10. Thereafter, operating voltages for driving the liquid crystal can be supplied from the liquid crystal display control circuit through the connected terminals 10 and the connection terminals 5.

Figures 16, 19:
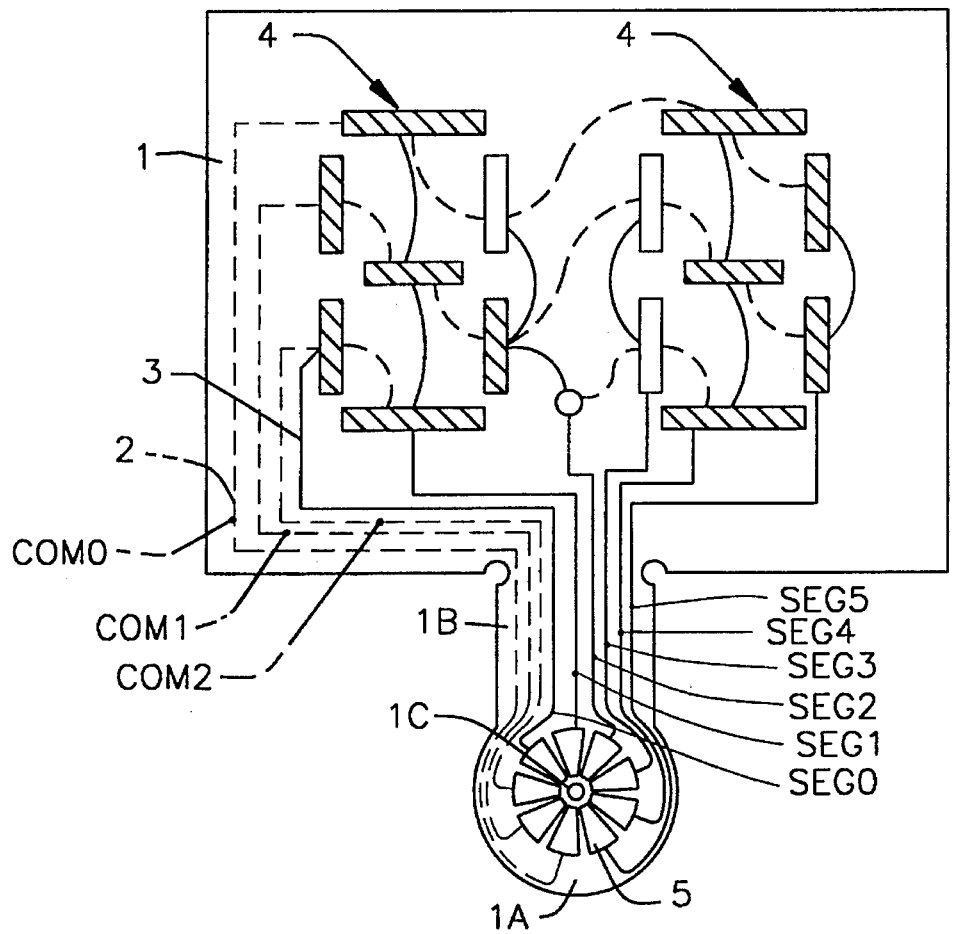
FIG. 16 is a top plan view showing an example of wiring of common electrodes and segment electrodes with respect to a liquid crystal display portion also shown in FIG. 1.
FIG. 19 is a diagram expressing selection and non-selection of voltage application to a common electrode and a segment electrode, by matrix.

The film LCD 1 (see FIG. 1) is arranged such that three common electrodes COM0~COM2 are wired respectively to segments that are display portions 4, as shown in FIG. 16, the LCD preferably being driven by a well-known time-division drive in a manner of three divisions (⅓ duty) as is described in detail in the "USER'S MANUAL OF NEC" described hereinabove and incorporated herein by reference thereto. Further, the segment electrodes are wired in accordance with required pixels. Here, six (6) segment electrodes SEG0~SEG5 are wired.

Figure 17:
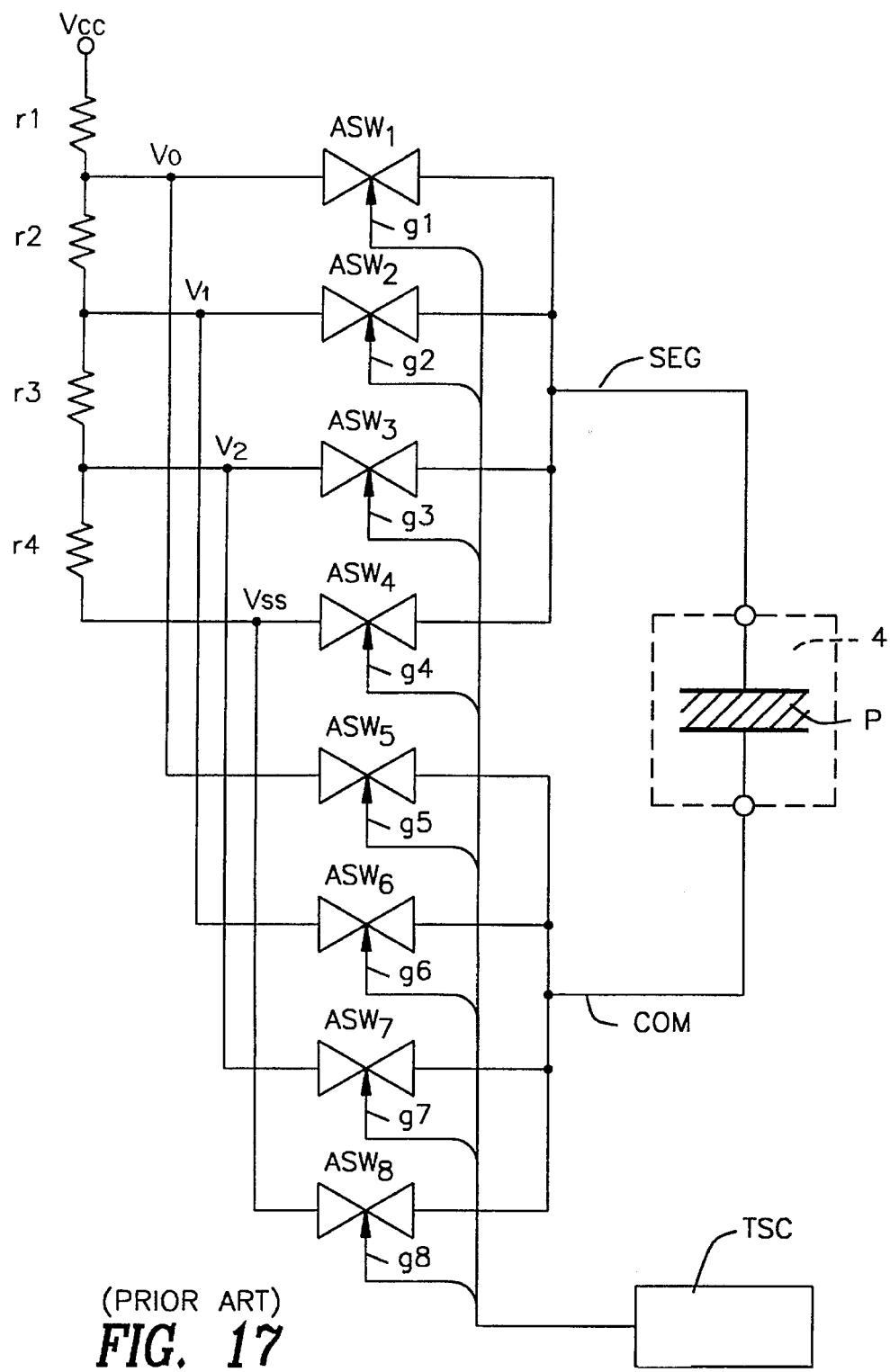
FIG. 17 is an electric circuit diagram showing an example of a conventional liquid crystal display control circuit for use with the device of FIG. 16.

The liquid crystal display control circuit controls the voltage applied to the common electrodes COM0~COM2 and the segment electrodes SEG0~SEG5. One conventional liquid crystal display control circuit is arranged as shown in FIG. 17, as an example. The control circuit shown controls a single segment electrode SEG, which is arranged to provide voltages V0~Vss by dividing power source voltage Vcc by potential resistances r1~r4, these voltages being applied to terminals of respective analog switches ASW1~ASW8. The terminals of the analog switches ASW1~ASW4 are connected to the segment electrodes, while the terminals of the remaining analog switches ASW5~ASW8 are connected to the common electrode. The analog switches ASW1~ASW8 are arranged such that a control signal is applied to gate electrodes g1~g8 from a timing-signal generating circuit TSC.

Figure 18:
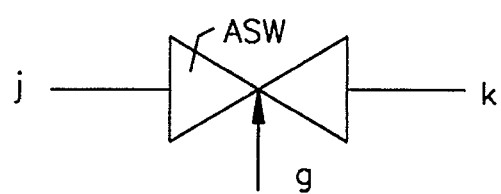
FIG. 18 is an enlarged view of a conventional analog switch employed in the control circuit of FIG. 17.

FIG. 18 shows a well known analog switch ASW which operates such that, a location between both terminals j–k is isolated or insulated when the control signal is not applied to the gate electrode g and, when the control signal is applied to the gate electrode g, the location between both the terminals j–k is conducted, so that the voltage applied to the terminal j is outputted to the terminal k.

Figure 20:
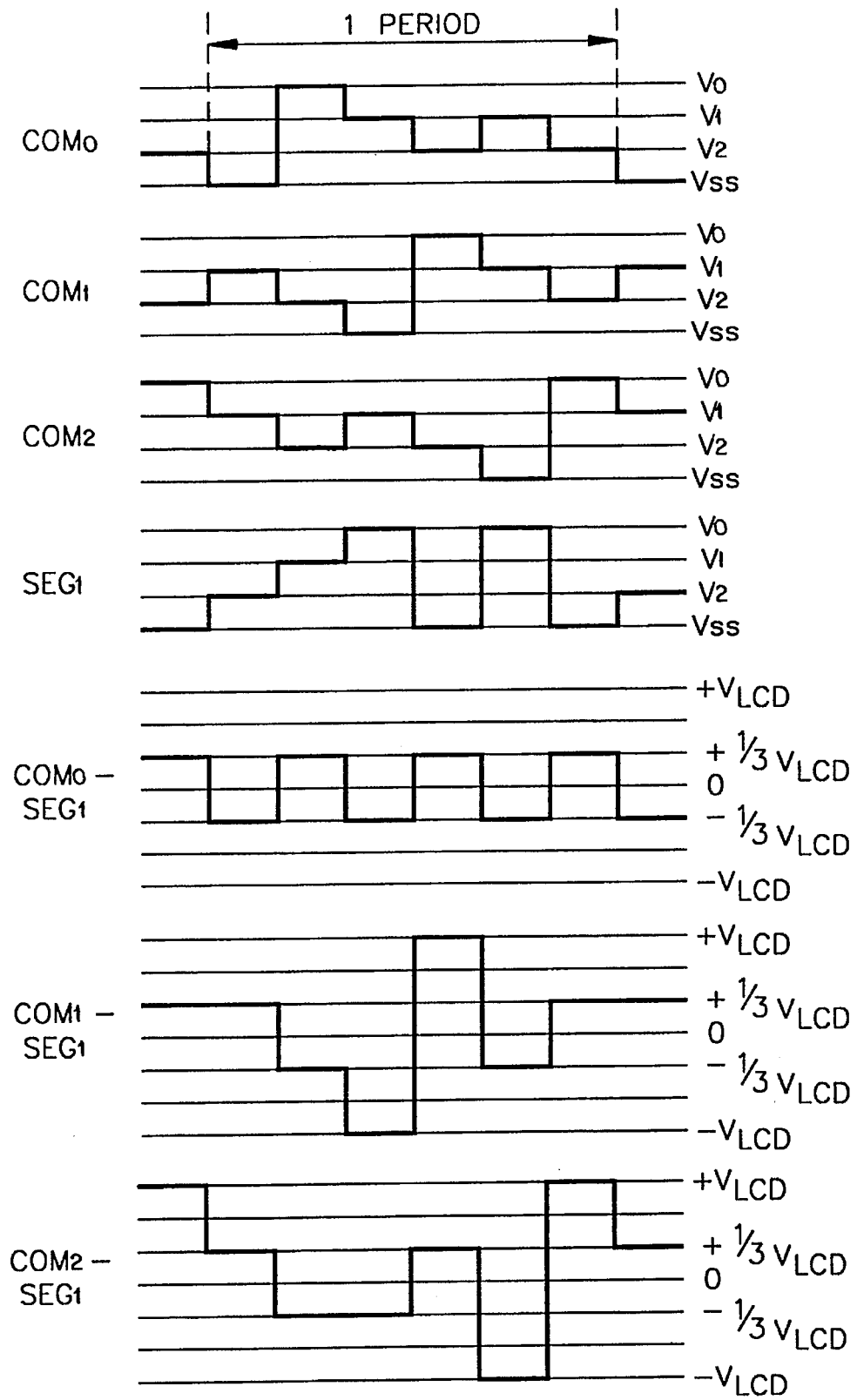
FIG. 20 is a waveform view showing an example of 3—Time-Division LCD Drive Waveforms in the conventional circuit of FIG. 16.

Accordingly, if the gate electrodes g1–g8 are turned ON and OFF by a timing control signal as illustrated in FIG. 20, which is generated from the timing-signal generating circuit TSC, selective and nonselective voltages are applied to the pixel P of the LCD. The applied voltage is also controlled such that contrast between turning-on and turning-off of each of the pixels is optimized.

FIG. 20 shows an example of 3—Time-Division LCD Drive Waveforms (⅓ Bias Modulus) in a case where the decimal numeral "63", for example, is displayed by the film LCD 1. Generally, the ⅓ Bias method is used with respect to driving of ⅓ duty. When numeral "63" is displayed, locations rewritten by "O" of the matrix illustrated in FIG. 19 should be selected. Locations of the blank portions are brought to non-selection.

Drive waveforms of selection and nonselection are such that a control signal having waveform as shown in FIG. 20 is applied to the common electrodes COM0~COM2 and the segment electrodes SEG0~SEG5. That is, the waveforms COM1~SEG1 and COM2–SEG1 in FIG. 20 are waveforms displayed, and correspond to the above-described "O" of the matrix, while the waveforms COM0–SEG1 correspond to "x". That is, display is obtained if an effective value of the alternate voltage which is applied to the selected pixel rises or is raised.

Figure 2:
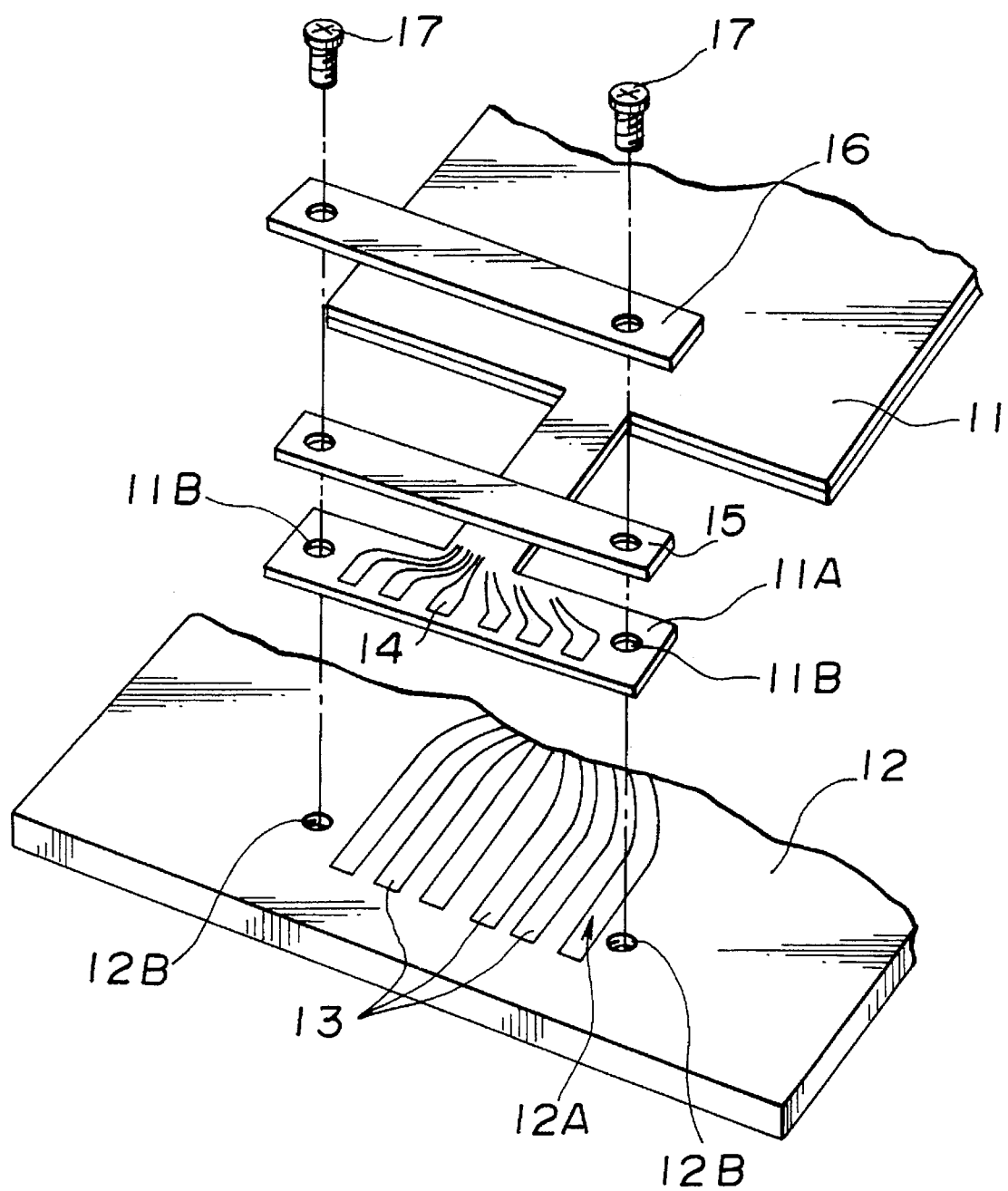
FIG. 2 is an exploded view of the construction of a connection means for connecting a liquid crystal display to a liquid crystal drive circuit board in accordance with a second embodiment of the present invention.

FIG. 2 is a schematic diagram of the structure of connection between a liquid crystal display and a circuit board for driving the liquid crystal display in accordance with a second embodiment of the present invention.

In this embodiment, connected terminals 13 provided as a second group of connection terminals and formed on a connected terminal portion 12A which is an end portion of a liquid crystal drive circuit board 12 having a liquid crystal display control circuit are formed of a plurality of terminals in the form of thin strips arranged parallel to each other.

If such connected terminals 13 are used, a film LCD 11 using a pair of transparent engineering plastic films forming transparent bases has a connection terminal portion 11A formed on an end of an extended portion which extends from a middle portion of an edge of one of the pair of transparent films relative to the other film. The connection terminal portion 11A is elongated in a direction perpendicular to the direction of extension of the extended portion. A plurality of connection terminals 14 provided as a first group of connection terminals facing the connected terminals 13 are formed on the connection terminal portion 11A as thin strips arranged parallel in a straight row. Transparent conductor patterns extending from common electrodes and segment electrodes are connected to the connection terminals. The connection terminals are also formed of transparent conductor patterns. A pair of threaded holes 12B, through which a pair of connection fixing screws are passed for fastening, are formed in the connected terminal portion 12A of the circuit board 12 on the opposite sides of the connected terminals 13. Also, through holes 11B, through which the connection fixing screws 17 can pass, are formed through the connection terminal portion 11A on the opposite sides of the connection terminals 14.

In this embodiment, the connection terminal portion 11A formed on the film LCD 11 as described above is superposed on the connected terminal portion 12A at an end of the liquid crystal drive circuit board 12 so that the connection terminals 14 face the connected terminals 13 in a predetermined relationship. Thereafter, the connection fixing screws 17, having an elongated rubber pressing member 15 and a pressing member 16 fitted around their shank, are passed through the through holes 11b and are screwed into the threaded holes 12B of the circuit board 12. In this manner, the connection terminal portion 11A is fixed by screwing on the circuit board 12, and the connection terminals 14 are brought into contact with the connected terminals 13 by being pressed against the same, thereby establishing an electrical connection between the terminals 13 and 14. Thereafter, operating voltages for driving the liquid crystal can be supplied from the liquid crystal display control circuit through the connected terminals 13 and the connection terminals 14.

Connection terminals on a film LCD are arranged into a configuration such as that described above with respect to the first or second embodiment to enable the film LCD to be directly connected to a drive circuit board without any connector member. Needless to say, the liquid crystal drive circuit board, formed by a hard circuit board in the above-described embodiments, may alternatively be a flexible printed circuit board (FPC).

Figure 3:
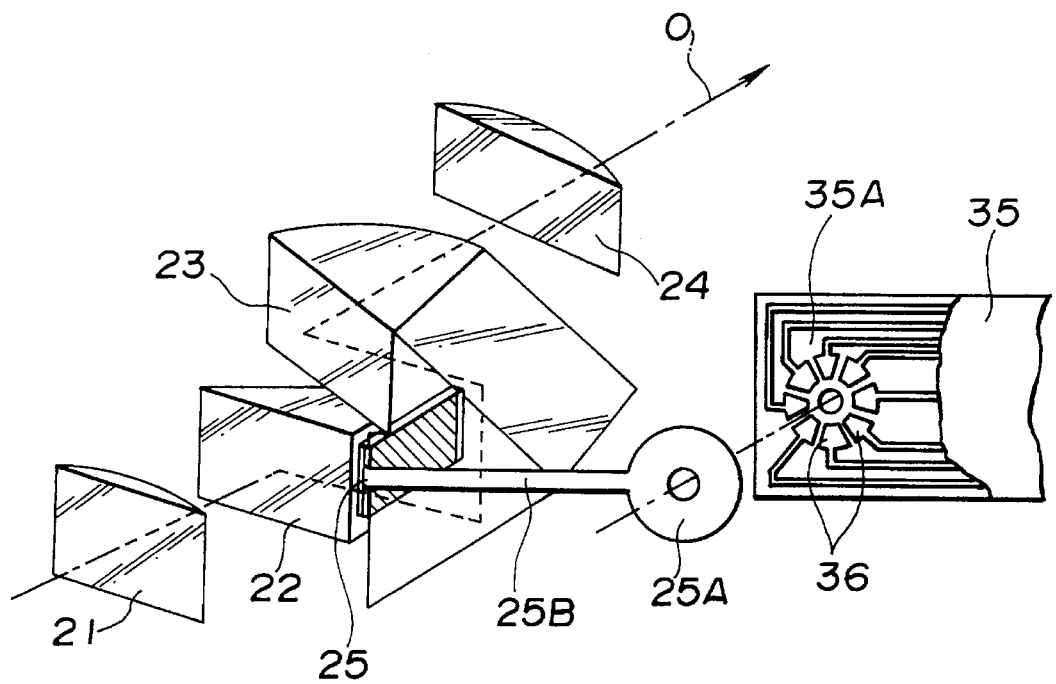
FIG. 3 is a perspective view of a third embodiment of the present invention in which a liquid crystal display of the invention is disposed in a finder optical system of a camera.

FIG. 3 shows a third embodiment of the present invention in which a liquid crystal display formed of a film LCD having the above-described electrode configuration is applied for use as a finder of a camera.

For example, a finder optical system of the camera is formed by an objective lens 21, a first prism 22, a second prism 23 and an ocular lens 24. A finder optical path 0 is formed so that light from an object incident upon the objective lens 21 is reflected by the first prism 22 to travel to the second prism 23 and is reflected by the prism 23 three times to travel to the ocular lens 24.

In the thus-arranged finder optical system, a film LCD 25 constructed as described above is disposed between an emergence surface of the first prism 22 and an incidence surface of the second prism 23. A connection terminal portion 25A, which is formed on an end of an extended portion 25B which is formed by extending a part of the film LCD 25, is superposed on a connected terminal portion 35A of a liquid crystal drive circuit board 35, with first connection terminals (not shown) on the connection terminal portion 25A facing connected terminals 36, i.e., second connection terminals in a predetermined relationship. The terminal portions 25A and 35A are then pressed on each other by being fastened with a screw so that the terminals are connected electrically, thereby enabling operating voltages for driving the liquid crystal to be supplied from the liquid crystal display control circuit through the connected terminals 36 and the connection terminals of the connection terminal portion 25A. By this arrangement, characters or the like displayed by the film LCD 25 can be viewed in the finder view field.

Figure 4A:
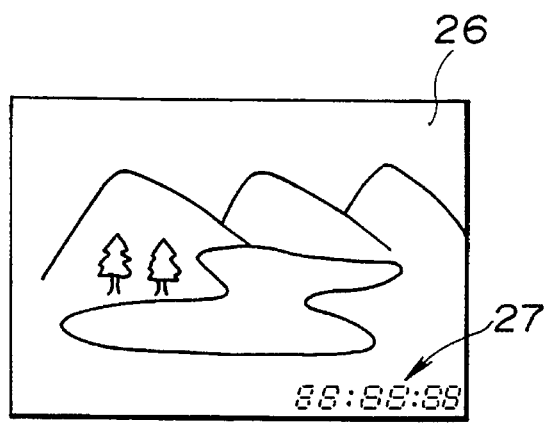
FIGS. 4A and 4B are front views of display states in a finder view field of the camera.
Figure 4B:
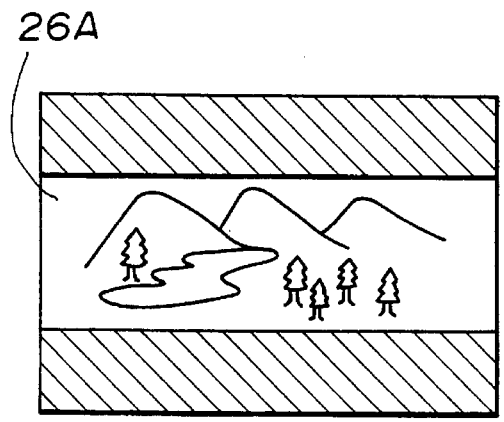

FIG. 4A shows an example of a display of a date 27 formed by the above-described film LCD 25 at a lower right position in a picture seen in an ordinary finder view field 26. FIG. 4B shows the formation of a display pattern on the film LCD 25 such that a finder view field 26A of a widthwise panoramic print size is formed when a photographing frame of the camera is changed from an ordinary size to the widthwise panoramic size. That is, in this case, a display pattern on the film LCD is formed so as to cover upper and lower areas of the finder frame (shown cross-hatched). Thus, a panoramic finder can be easily formed by controlling the display on the LCD when a panoramic mode is selected.

Figure 5:
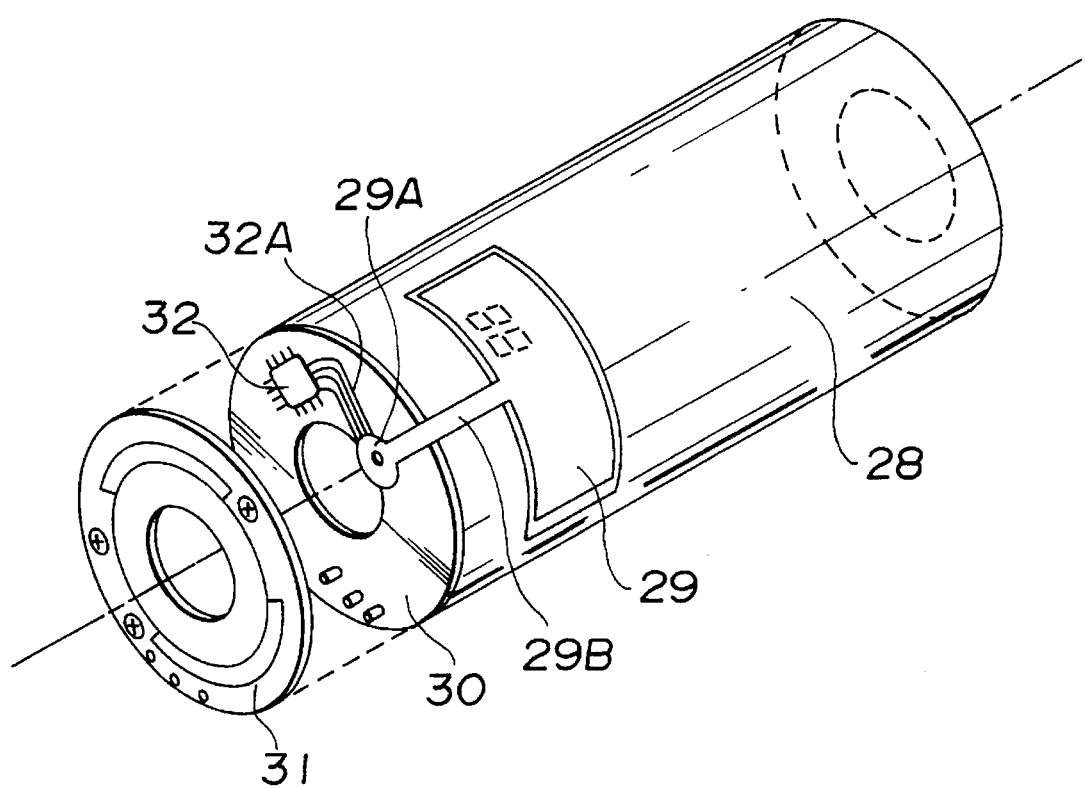
FIG. 5 is a perspective view of a fourth embodiment of the present invention in which a liquid crystal display of the invention is disposed in a lens barrel of a camera.

FIG. 5 shows a fourth embodiment of the present invention in which a liquid crystal display formed by a film LCD having the above-described electrode configuration is applied to a display device for use in a lens barrel of a camera.

In the fourth embodiment, a film LCD 29 constructed as described above is mounted in a lens barrel 28 to display information on the photographing distance to an object, the aperture, the shutter speed and the like. A control circuit substrate 32 having a circuit for driving the LCD 29 is mounted on a ring-like liquid crystal drive circuit board 30 disposed in the vicinity of a lens mount 31 for detachably mounting the lens barrel to a camera body, and a connection terminal portion 29A of the film LCD 29 is pressed against and fixed on a connected terminal portion 32A of the control circuit substrate 32. In this case, an extended portion 29B extending from the film LCD 29 and having the connection terminal portion 29A formed at its end is extended along an internal curved surface of the lens barrel 28 and is thereafter turned inwardly by 90° so that the connection terminal portion 29A is superposed on the connected terminal portion 32A. These terminal portions are then pressed on each other with a screw to be connected electrically.

When the liquid crystal display is driven by the control circuit, the photographing distance, the aperture value, the shutter speed and the like are displayed in a display window formed in an outer surface of the lens barrel 28. In the above-described manner, the liquid crystal display of the present invention can be freely disposed even in a lens barrel.

Needless to say, the liquid crystal display may be mounted in a camera body as well as in a lens barrel.

Figure 6:
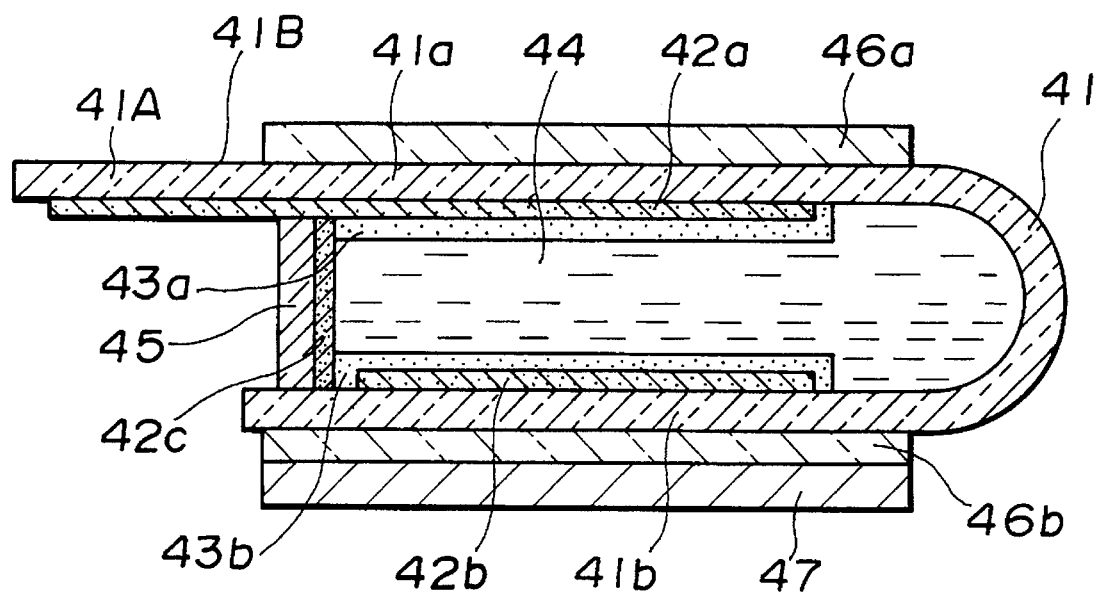
FIG. 6 is a cross-sectional view of an essential portion of a liquid crystal display in accordance with a fifth embodiment of the present invention.
Figure 7:
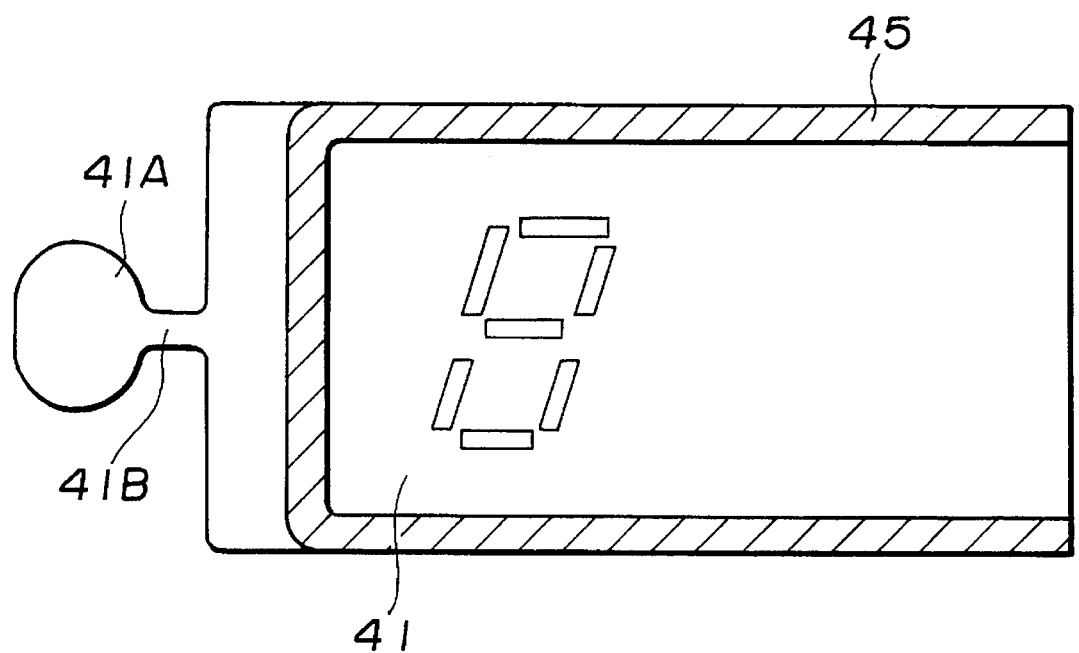
FIG. 7 is a schematic plan view of the fifth embodiment liquid crystal display.

FIGS. 6 and 7 show a liquid crystal display in accordance with a fifth embodiment of the present invention.

In this liquid crystal display, a film LCD is constructed by using a sheet of transparent engineering plastic film forming a flexible transparent base on which transparent electrodes are disposed. That is, one sheet of plastic film 41 is folded to provide films 41a and 41b facing each other. An electrode 42a and an orientation film 43a are provided on an inner surface of the film portion 41a, while an electrode 42b and an orientation film 43b are provided on an inner surface of the film portion 41b facing that of the film portion 41a. An electrode 42c is also provided. A liquid crystal 44 is injected into a space surrounded by these members, and three sides of this space is closed with a sealing member 45. A polarizing plate 46a is provided on an outer surface of the film portion 41a, while a polarizing plate 46b and a reflecting plate 47 are provided on an outer surface of the other film portion 41b.

A middle portion of an edge of the film portion 41a is extended relative to the corresponding portion of the other film portion 41b to form an extended portion 41B, and an end of the extended portion 41B is formed into a circular shape, thereby forming a connection terminal portion 41A. First connection terminals extending from the electrodes 42a, 42b and 42c are formed on the connection terminal portion 41A. The first connection terminals formed on the connection terminal portion 41A are formed in a configuration such as to be opposed to the configuration of connected electrodes formed on a liquid crystal drive circuit board (not shown for purposes of simplicity) having a liquid crystal display control circuit which is to be connected to the film LCD.

In the thus-constructed liquid crystal display, upper and lower film members are formed by one integral film member utilizing the flexibility of the film member to great advantage. The need for a working operation for cutting a transparent plastic film into two sheets is thereby eliminated.

Figure 8:
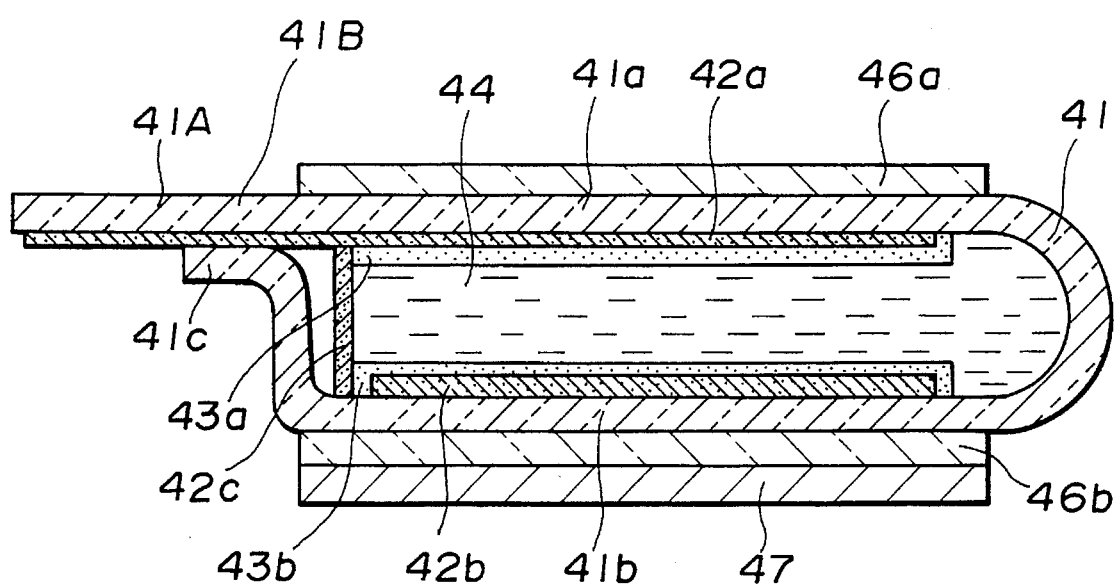
FIG. 8 is a cross-sectional view of an essential portion of a liquid crystal display in accordance with a sixth embodiment of the present invention.
Figure 9:
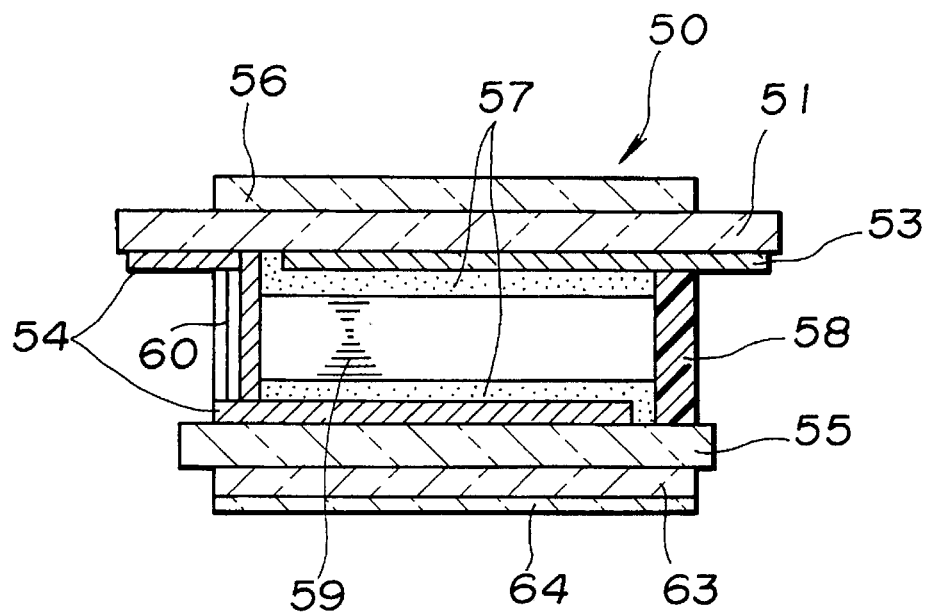
FIG. 9 is a cross-sectional view of an example of a conventional glass type liquid crystal display.
Figure 10:
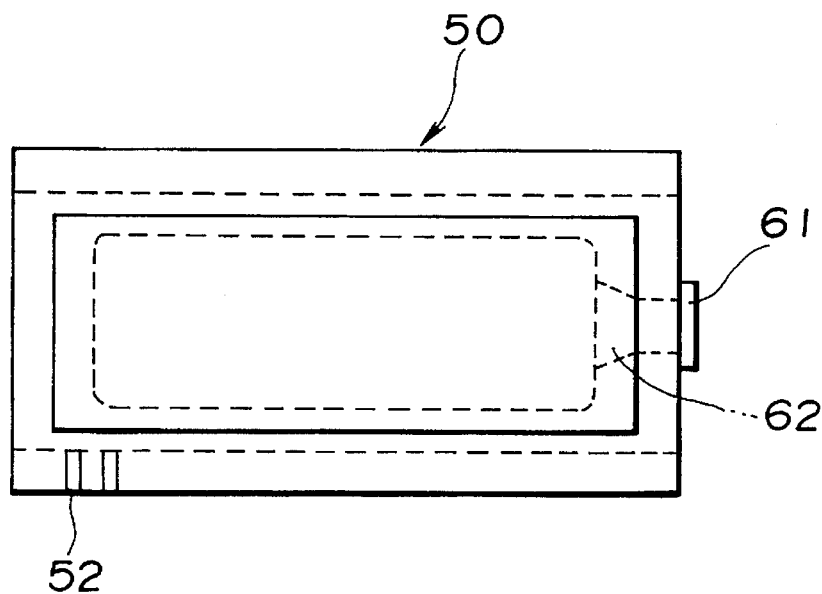
FIG. 10 is a plan view of the glass type liquid crystal display shown in FIG. 9.
Figure 11:
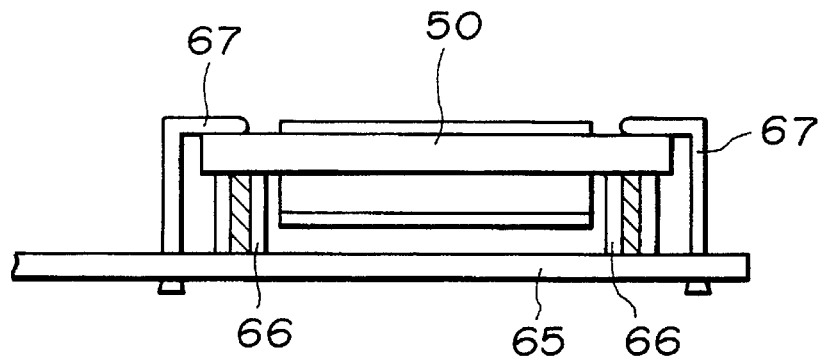
FIG. 11 is a front view of an example of conventional means for connecting a glass type liquid crystal display and a liquid crystal drive circuit board.
Figure 12:
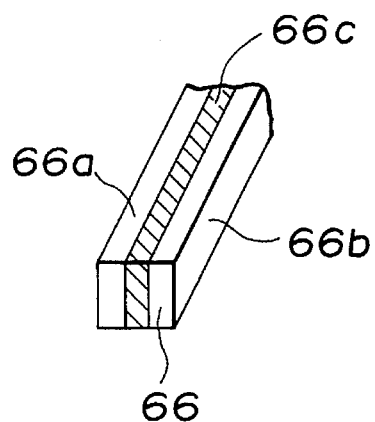
FIG. 12 is a perspective view of a conductive rubber connector used as the connection means shown in FIG. 11.
Figure 13:
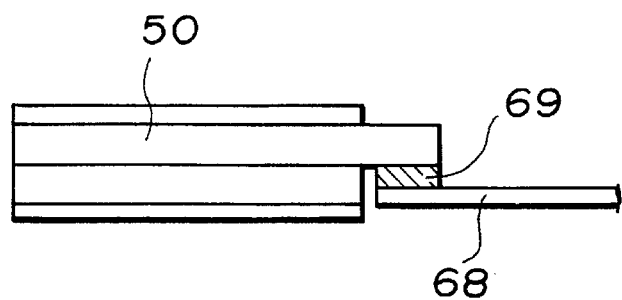
FIG. 13 is a front evaluation view of another example of conventional means for connecting a glass type liquid crystal display and a liquid crystal drive circuit board.
Figure 14:
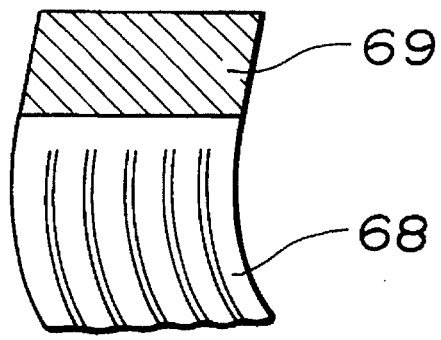
FIG. 14 is a perspective view of an anisotropic connector used as the connection means shown in FIG. 13.
Figure 15:
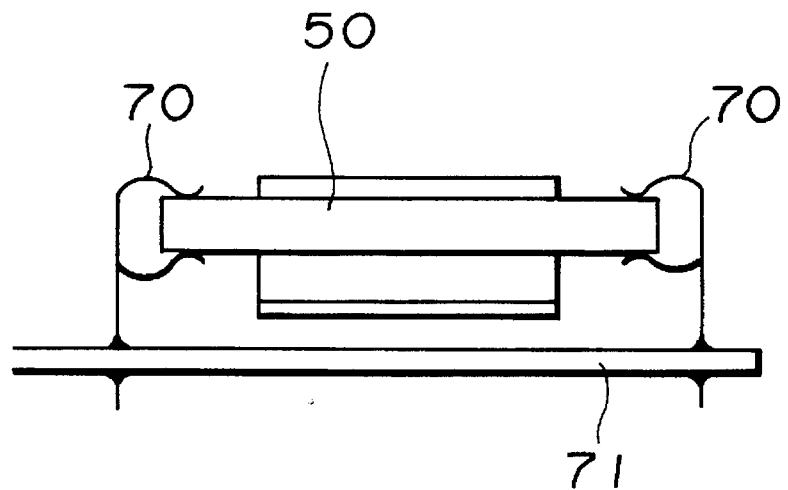
FIG. 15 is a front evaluation view of a further example of conventional means for connecting a glass type liquid crystal display and a liquid crystal drive circuit board.

FIG. 8 shows a liquid crystal display in accordance with a sixth embodiment of the present invention.

In this liquid crystal, a peripheral portion of the film portion 41b opposed to the film portion 41a is bent to close a side of the space between the films without using the sealing member 45 of the fifth embodiment. The bent portion has a flange-like end 41c which is fixed to a peripheral portion of the film 41b by an adhesive or the like. In this manner, one sheet of transparent plastic film is formed into a sack-like shape. A liquid crystal 44 is injected into and enclosed in the film sack. In all other respects, this embodiment is the same as the fifth embodiment.

The thus-constructed liquid crystal display has a simpler structure and can be manufactured at a lower cost, since sealing member 45 (see FIG. 6) can be removed.

What is claimed is:

1. A liquid crystal display in which transparent electrodes are formed on a pair of flexible transparent bases facing each other, and in which a liquid crystal is enclosed inside the bases, said liquid crystal display comprising:

an extended portion formed by extending an end portion of one of the pair of transparent bases together with the transparent electrodes;

connection terminal means formed on an end of said extended portion and connected to connected terminal means for applying operating voltages to the transparent electrodes; and said connection terminal means being formed to provide an electrode arrangement corresponding to an electrode arrangement of the connected terminal means, electrodes of said electrode being formed in a many-petaled corolla-like configuration of sectors divided from a circle at equal angles.

2. A liquid crystal display according to claim 1, wherein the connected terminal means is provided on a liquid crystal drive circuit board having a liquid crystal display control circuit.

3. A finder device of a camera comprising a liquid crystal display according to claim 1, wherein a display portion of said liquid crystal display is disposed in an optical path of a finder optical system so that a display on said display unit is superposed on a finder image.

4. A liquid crystal display in which transparent electrodes are formed on a pair of flexible transparent bases facing each other, and in which a liquid crystal is enclosed inside the bases, said liquid crystal display comprising:

an extended portion formed by extending an end portion of one of the pair of transparent bases together with the transparent electrodes;

first connection terminal means formed on an end of said extended portion and having electrodes formed in an electrode configuration corresponding to an electrode configuration of said connected terminal means for applying operating voltages to the transparent electrodes;

second connection terminal means provided as said connected terminal means, said second connection terminal means being arranged so that said first connection terminal means can be connected to said second connection terminal means, said second connection terminal means being provided on an electric circuit board separate from the transparent bases; and press-fixing means for maintaining electrodes of said second connection terminal means and the electrodes of said first connection terminal means in contact with each other in an opposed position by pressing the electrodes on each other;

said electric circuit board being formed of a liquid crystal drive circuit board having a liquid crystal display control circuit, the electrodes of each of said first connection terminal means and second connection terminal means being formed in a many-petaled corolla-like configuration corresponding to the configuration of sectors divided from a circle at equal angles.

5. A finder device of a camera capable of superposing light other than object reflected light on a finder image, said finder device comprising:

liquid crystal display means disposed in an optical path of a finder optical system and having a pair of flexible transparent bases facing each other, transparent electrodes formed on the bases and a liquid crystal enclosed between the bases;

a liquid crystal drive circuit board disposed at a position removed from the finder optical system and having a drive control circuit for controlling said liquid crystal display means;

an extended portion formed by extending an end portion of one of the pair of transparent bases together with the transparent electrodes;

first connection terminal means formed on an end of said extended portion and having electrodes formed in an electrode configuration corresponding to an electrode configuration of connected terminal means for applying operating voltages to the transparent electrodes;

second connection terminal means provided as said connected terminal means, said second connection terminal means being provided on said liquid crystal drive circuit board, said second connection terminal means having the electrode configuration corresponding to the electrode configuration of said first connection terminal means; and press-fixing means for maintaining the electrodes of said first connection terminal means and electrodes of said second connection terminal means in contact with each other in an opposed position by pressing the electrodes against each other.

6. A liquid crystal display in which a liquid crystal is driven by an electrical signal to display information in the form of a picture, a character or the like, said liquid display comprising:

a plastic film which is flexible and transparent for enclosing the liquid crystal;

transparent electrodes formed on said plastic film to apply electrical signals to the liquid crystal;

an extended portion formed into a circular shape by extending an end portion of said base together with said transparent electrodes; and a pressure contact connection terminal means formed on an end of said extended portion of a circular shape and connected to said transparent electrodes.

7. A liquid crystal display according to claim 6, wherein said extended portion formed into a circular shape has a many-petaled corolla-like configuration corresponding to a configuration of sectors divided from a circle at equal angles.

8. A liquid crystal display in which a liquid crystal is enclosed between a pair of flexible transparent bases facing each other and having transparent electrodes formed thereon, said liquid crystal display comprising:

an extended portion having a many-petaled corolla-like configuration formed by extending an end portion of one of the pair of transparent bases together with the transparent electrodes;

first connection terminal means formed on an end of said extended portion;

a circuit board on which a liquid crystal drive circuit is mounted;

second connection terminal means formed on said circuit board to apply electrical signals to said transparent electrodes; and press-fixing means for pressing said first and second connection terminal means together to provide electrical connections therebetween.

9. A liquid crystal display according to claim 8, wherein said press-fixing means comprises screw fastening means.

10. A liquid crystal display in which a liquid crystal is enclosed between portions of at least one flexible base, said liquid crystal display comprising:

first connection terminal means formed substantially into a circular shape on an end of the base;

second connection terminal means formed into a shape which is the same as that of said first connection terminal means on the base to transmit electrical signals; and press-fixing means for pressing said first and second connection terminal means on each other to electrically connect the same.

11. A flexible liquid crystal display in which a liquid crystal is enclosed by film means, said liquid crystal display comprising:

electrical connection terminal means formed by said film means extending from said liquid crystal display in which a liquid crystal is enclosed, said connection terminal means including a plurality of electrode patterns formed in a many-petaled corolla-like configuration and led out of the liquid crystal display, said electrode patterns being directly connected to electrode patterns formed in a many-petaled corolla-like configuration in another electrical connection terminal means to another electrical connection terminal means having a surface different from one of a flat or curved surface on which the body of the liquid crystal display is disposed.

12. A liquid crystal display according to claim 11, wherein said electrical connection terminal means is connected to another electrical connection terminal means by being pressed against the electrical connection terminal means.

13. A liquid crystal display in which a liquid crystal is enclosed between a pair of flexible transparent bases facing each other and having transparent electrodes formed thereon, said liquid crystal display comprising:

an extended portion having a many-petaled corolla-like configuration formed by extending an end portion of one of the pair of transparent bases together with the transparent electrodes;

first connection terminal means formed on an end of said extended portion;

a circuit board on which a liquid crystal drive circuit is mounted;

second connection terminal means formed on said circuit board to apply electrical signals to said transparent electrodes; and press-fixing means for pressing said first and second connection terminal means together to provide electrical connections therebetween;

said press-fixing means comprising means for releasably pressing said first and second connection terminal means, said releasable coupling means comprises a pressing member;

a resilient compressible member arranged between said pressing member and said first connection terminal means; and threaded fastening means securing said pressing member to said second connection terminal means for maintaining the first and second connection terminal means in firm engagement;

said first and second connection terminal means being provided with electrodes arranged in a circular pattern; and said pressing member being a ring-shaped washer.

* * * * *